United States Patent
Goldblatt et al.

(10) Patent No.: US 11,916,580 B2
(45) Date of Patent: Feb. 27, 2024

(54) ON-CHIP NETWORK ANALYZER

(71) Applicant: QUALCOMM Incorporated, San Diego, CA (US)

(72) Inventors: Jeremy Goldblatt, Encinitas, CA (US); Chinmaya Mishra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 110 days.

(21) Appl. No.: 17/448,543

(22) Filed: Sep. 23, 2021

(65) Prior Publication Data

US 2023/0106620 A1 Apr. 6, 2023

(51) Int. Cl.
*H04B 1/04* (2006.01)
*G01R 27/16* (2006.01)
*H01P 5/18* (2006.01)
*H03F 1/32* (2006.01)
*H03F 3/24* (2006.01)

(52) U.S. Cl.
CPC ........... *H04B 1/0475* (2013.01); *G01R 27/16* (2013.01); *H01P 5/18* (2013.01); *H03F 1/3241* (2013.01); *H03F 3/245* (2013.01); H03F 2200/451 (2013.01); H04B 2001/0425 (2013.01)

(58) Field of Classification Search
CPC .......... H04B 1/0475; H04B 2001/0425; H03F 1/3241; H03F 3/245; H03F 2200/451; G01R 27/16; H01P 5/18
USPC ......................................................... 375/297
See application file for complete search history.

(56) References Cited

U.S. PATENT DOCUMENTS

| | | | |
|---|---|---|---|
| 8,699,975 B1 | 4/2014 | Schleicher et al. | |
| 10,498,004 B1 * | 12/2019 | Ji | H01P 5/18 |
| 2014/0004810 A1 | 1/2014 | Cohen et al. | |
| 2017/0026020 A1 * | 1/2017 | Solomko | H01P 5/184 |
| 2018/0294540 A1 | 10/2018 | Cheng et al. | |
| 2020/0007092 A1 * | 1/2020 | Wang | H03F 3/19 |

FOREIGN PATENT DOCUMENTS

| | | | |
|---|---|---|---|
| WO | 03075484 A1 | 9/2003 | |
| WO | WO-03075484 A1 * | 9/2003 | H03G 3/3047 |

OTHER PUBLICATIONS

International Search Report and Written Opinion—PCT/US2022/041052—ISA/EPO—dated Dec. 8, 2022.

* cited by examiner

*Primary Examiner* — Kevin M Burd
(74) *Attorney, Agent, or Firm* — QUALCOMM Incorporated

(57) ABSTRACT

An integrated circuit operable to measure an impedance presented to a transmitter path of the integrated circuit and a method thereof are provided. The integrated circuit includes a directional coupler that has an input port, a through port, a coupled port, and an isolation port. The integrated circuit also includes a power amplifier coupled to the input port of the directional coupler, a power detector configured to measure output levels from the coupled port and the isolation port of the directional coupler, a reference signal generator coupled to the isolation port of the directional coupler, and a vector modulator configured to adjust a phase of a signal generated from the power amplifier.

26 Claims, 13 Drawing Sheets

$$\begin{bmatrix} b1 \\ b2 \\ b3 \\ b4 \end{bmatrix} = \begin{bmatrix} 0 & \sqrt{1-C^2} & jc & 0 \\ \sqrt{1-C^2} & 0 & 0 & jc \\ jc & 0 & 0 & \sqrt{1-C^2} \\ 0 & jc & \sqrt{1-C^2} & 0 \end{bmatrix} \cdot \begin{bmatrix} a1 \\ a2 \\ a3 \\ a4 \end{bmatrix}$$

FIG. 9

ON-CHIP NETWORK ANALYZER

FIELD OF THE INVENTION

The present disclosure relates generally to an integrated circuit with a transmitter path (or a transceiver path), and more particularly, to measuring an impedance presented to the transmitter path (or the transceiver path) of the integrated circuit by using on-chip components.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system, or a New Radio (NR) system).

A wireless device used in a wireless communication system (e.g., a base station or a smart phone) may include a transmitter and a receiver coupled to an antenna to support two-way communication. For data transmission, the transmitter may modulate a carrier signal with data to obtain a modulated signal, amplify the modulated signal to obtain an output signal having the proper power level, and transmit the output signal via the antenna to other wireless devices. For data reception, the receiver may obtain a received signal via the antenna and may condition and process the received signal to recover data. A wireless device may also include multiple transmitters and/or multiple receivers coupled to multiple antennas. Vector modulators may be integrated in transmitter paths to adjust phases of the transmitting signals for beamforming in order to improve device performance. Accurately determining impedance presented to ports of an integrated circuit (IC) may also be important to improve device performance.

SUMMARY

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

For example, in an aspect of the disclosure, a circuit includes a directional coupler having an input port, a through port, a coupled port, and an isolation port; a power amplifier coupled to the input port of the directional coupler; a power detector configured to measure output levels from the coupled port and the isolation port of the directional coupler; a reference signal generator coupled to the isolation port of the directional coupler; and a vector modulator configured to adjust a phase of a signal generated from the power amplifier.

In another exemplary aspect of the disclosure, an integrated circuit is provided that includes a first transmitter path that comprises a first vector modulator, a first power amplifier, a first directional coupler, and a power detector coupled to two ports of the first directional coupler; and a second transmitter path that comprises a second vector modulator, a second power amplifier, wherein the second power amplifier is coupled to at least one of the two ports of the first directional coupler.

In another exemplary aspect of the disclosure, a method of measuring impedance presented to a port of an integrated circuit, the integrated circuit including a directional coupler, the method including: measuring a voltage level at a second port of the directional coupler in response to a first input received at a first port of the directional coupler; measuring a voltage level at a third port of the directional coupler in response to the first input received at the first port of the directional coupler; coupling a second input to the second port of the directional coupler; measuring a voltage level at the second port of the directional coupler while adjusting a phase difference between the first input and the second input; measuring a voltage level at the third port of the directional coupler while adjusting the phase difference between the first input and the second input; and determining an impedance looking into the first port of the directional coupler based on the measured voltage levels and the adjusted phase differences.

In yet another exemplary aspect of the disclosure, a circuit is provided that includes a transmitter output coupled to an input port of a coupler; means for measuring power levels at a first output port of the coupler and a second output port of the coupler; means for coupling a reference signal to the first output port of the coupler; and means for sweeping a phase of the transmitter output.

Other aspects, features, and implementations of the present disclosure will become apparent to those of ordinary skill in the art, upon reviewing the following description of specific, exemplary implementations of the present disclosure in conjunction with the accompanying figures. While features of the present disclosure may be discussed relative to certain implementations and figures below, all implementations of the present disclosure can include one or more of the advantageous features discussed herein. In other words, while one or more implementations may be discussed as having certain advantageous features, one or more of such features may also be used in accordance with the various implementations of the disclosure discussed herein. In similar fashion, while exemplary implementations may be discussed below as device, system, or method implementations it should be understood that such exemplary implementations can be implemented in various devices, systems, and methods.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various implementations and to explain various principles and advantages in accordance with the present disclosure.

FIG. 9 is a block diagram illustrating an example directional coupler and an associated matrix of scattering parameters (s-parameters), according to aspects of the present disclosure.

DETAILED DESCRIPTION

Wireless devices may operate over a wide array of spectrum bands, for example, from low-frequency bands below about 1 gigahertz (GHz) to high-frequency bands such as millimeter wave (mm-wave) bands. It may be challenging to design and characterize transmitters in the wireless devices, especially at mm-wave bands. For example, accurately determining impedance presented to ports of an integrated circuit (IC) is important. Knowledge of this impedance is helpful in characterizing impedance of the IC by de-embedding it from a measurement result, which is often a lump sum of the impedance of the IC ports and the impedance presented to these ports. Knowledge of this impedance is also useful during the operations of an IC, such as allowing digital or analog predistortion to be implemented on-the-fly. However, accurately determining impedance is difficult. For example, during characterization of an IC operating at mm-wave bands, being able to differentiate the IC from peripheral testing fixtures may be a very difficult task and almost impossible without using sophisticated tools, such as a vector network analyzer (VNA) operable at a very high frequency.

Figure 1:
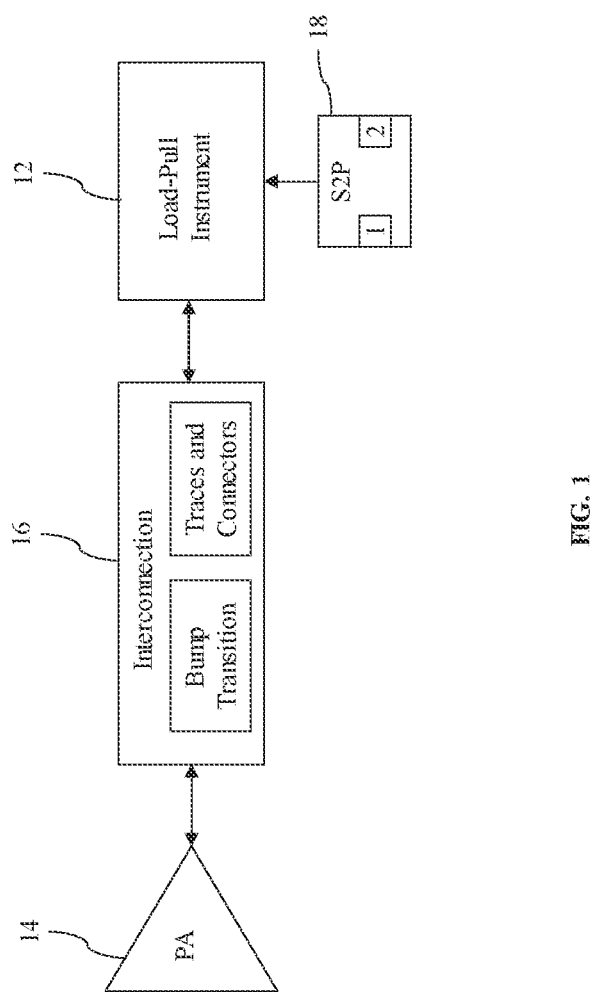
FIG. 1 is a schematic diagram illustrating a mm-wave IC characterization platform having a load-pull instrument performing an impedance measurement of a power amplifier in the related art.

The development of transmitters (or transceivers) in wireless devices, especially at mm-wave bands, thus may be a lengthy process and may involve many design iterations. Taking power amplifiers as an example, the performance (e.g., the gain, efficiency, and linearity) of a power amplifier module may be sensitive to impedance mismatch. However, it may be difficult to directly probe the IC with a VNA because errors presented in measurement may easily exceeds resolution required. The impedance of the power amplifier is often acquired through indirect measurements. FIG. 1 illustrates a mm-wave IC characterization platform having a load-pull instrument 12 (such as a VNA) performing an impedance measurement of a power amplifier 14 through an interconnection 16. The interconnection 16 provides a signal path allowing on-chip signals to flow into external devices and vice versa. The interconnection 16 may include bump transition (e.g., soldering bumps on packages) and traces and connectors (e.g., bond wires and subminiature push-on (SMP) connectors).

The direct measurement results acquired by the load-pull instrument 12 are the impedance looking into the interconnection 16. To acquire the impedance of the power amplifier 14, an embedding file 18 representing the interconnection 16 (e.g., a two-port S2P file) is provided to the load-pull instrument 12 to de-embed the impedance introduced by the interconnection 16 from the direct measurement in order to unveil the impedance of the power amplifier 14 itself. However, the embedding file 18 may not accurately represent the actual interconnection 16 due to various reasons. For example, the embedding file 18 may be acquired by different methods, such as a direct measurement of a sample interconnection 16 or by simulating a 3D model of the interconnection 16 in an electromagnetic simulation software (e.g., Ansys HFSS), which may differ significantly. Also, board manufacturing variation (e.g., layer height, metal thickness, and etching), SMP connector tolerances, and soldering tolerances all introduce board-to-board variation. Accordingly, without accurate knowledge of the actual impedance presented to the power amplifier 14, the impedance of the power amplifier 14 cannot be accurately unveiled in turn. Thus, not knowing the actual impedance presented to the power amplifier 14 has impeded the characterization with increased costs and production delay. Generally, for both transmitters and receivers, knowing the impedance presented to the IC ports also have certain benefits other than being able to de-embed the interconnection 16. For example, knowing the impedance introduced by the interconnection 16 allows predistorting signals into the power amplifier 14 for better signal integrity.

To mitigate the complexity and high cost of acquiring accurate impedance presented to ports of an integrated circuit (IC), particularly in mm-wave bands, a direct characterization of impedance presented to the IC ports by using on-chip components is provided. The on-chip components in the present disclosure are configured to measure an impedance introduced to the IC ports in a way that resembles how a network analyzer directly measures an impedance connected to its port, by using amplitude and phase information of forward (or incident) and reverse (or reflected) power. To state in different words, the on-chip components of the IC are able to function as an on-chip network analyzer by measuring impedance from amplitude and phase of a scattering parameter (s-parameter). To provide a better appreciation of this on-chip impedance characterization, some background principles regarding directional coupler and its associated s-parameter matrix will be reviewed initially, followed by a detailed discussion of the on-chip impedance characterization implemented in a wireless device that includes an on-chip directional coupler. The wireless device is for illustrative purposes only and not intended to be limiting beyond what is specifically recited in the claims. The various concepts presented throughout this disclosure may be implemented across a broad variety of telecommunication systems, network architectures, and communication standards, and not necessarily limited for wireless applications.

Figure 2:
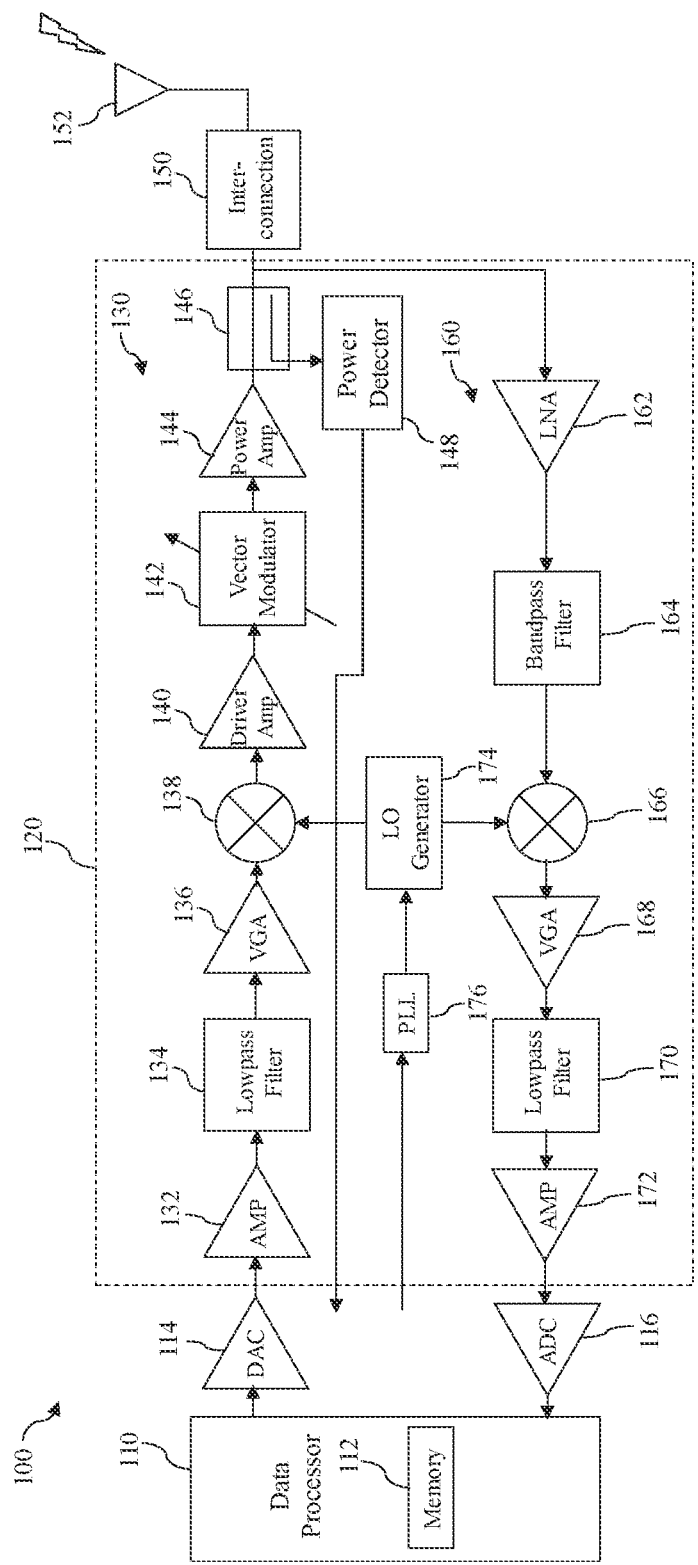
FIG. 2 is a schematic diagram illustrating a wireless device, according to aspects of the present disclosure.

Referring now to FIG. 2, as an illustrative example without limitation, various aspects of the present disclosure are illustrated with reference to a wireless device 100. In this example design, the wireless device 100 includes a data processor 110 and a transceiver 120. The transceiver 120 includes a transmitter 130 and a receiver 150 that support bi-directional wireless communication. In general, the wireless device 100 may include any number of transmitters and any number of receivers for any number of communication systems and any number of frequency bands. In the transmitter path, the data processor 110 processes data to be transmitted. A digital-to-analog converter (DAC) 114 converts the digital signal from the data processor 110 to an analog out signal and provides the analog output signal to the transmitter 130. Within the transmitter 130, the analog output signal is amplified by an amplifier (AMP) 132, filtered by a lowpass filter 134 to remove images caused by digital-to-analog conversion, amplified by a variable gain amplifier (VGA) 136, and upconverted from baseband to RF or IF signal by a mixer 138.

The upconverted signal may be filtered and further amplified by a driver amplifier 140 and routed through a vector modulator 142. The vector modulator 142 adjusts the gain and phase of the upconverted signal, which is useful for beamforming, and passes the upconverted signal to a power amplifier 144. The signal amplified by the power amplifier 144 is routed through a directional coupler 146 for sampling. A power detector 148 measures the sampled signal from the directional coupler 146 to sense the output power of the power amplifier 144. The power detector 148 feeds back to the data processor 110 the detected power level, which allows the data processor 110 to adjust the power level of the power amplifier 144. The signal after the directional coupler 146 is routed through interconnection 150 that includes bumps and traces at the package level and the board level and is transmitted via an antenna 152. As will be discussed in details below, configurations of the directional coupler 146 and the power detector 148, together with some other circuits, make it possible to measure impedance presented to the transmitter path. In some implementations, the directional coupler 146 works in mm-wave band. For example, an IF block (not shown) may be disposed between the data processor 110 and the transceiver 120 and upconvert the output signal from baseband to IF band, and the mixer 138 further upconverts the signal to mm-wave band.

In the receiver path, the antenna 152 receives signals from base stations and/or other wireless devices and provides a received signal, which is routed through the interconnection 150 and provided to the receiver 160. Within the receiver path, the received signal is amplified by a low noise amplifier (LNA) 162, filtered by a bandpass filter 164, and downconverted by a mixer 166. The downconverted signal is amplified by a VGA 168, filtered by a lowpass filter 170, and amplified by an amplifier 172 to obtain an analog input signal, which is provided to an analog-to-digital converter (ADC) 116. The ADC 116 coverts the analog input signal to a digital input signal and provides the digital input signal to the data processor 110.

FIG. 2 shows transmitter 130 and receiver 150 implementing a direct-conversion architecture, which frequency converts a signal between mm-wave band and baseband in one stage. The transmitter 130 and/or the receiver 150 may also implement a super-heterodyne architecture, which frequency converts a signal between mm-wave band and baseband in multiple stages. A local oscillator (LO) generator 174 generates and provides transmit and receive LO signals to the mixers 138 and 166, respectively. A phase locked loop (PLL) 176 (or frequency synthesizer that includes PLL 176) receives control information from the data processor 110 and provides control signals to the LO generator 174 to generate the transmit and receive LO signals at the proper frequencies.

FIG. 2 shows an example transceiver design. In general, the conditioning of the signals in the transmitter 130 and the receiver 150 may be performed by one or more stages of amplifier, filter, mixer, etc. These circuits may be arranged differently from the configuration shown in FIG. 2. Furthermore, other circuits not shown in FIG. 2 may also be used in the transmitter and receiver. For example, matching circuits may be used to match various active circuits in FIG. 2. Some circuits in FIG. 2 may also be omitted. For example, the antenna 152 and the transceiver 120 are for illustration purposes and do not necessarily limit the implementations of the present disclosure to include an antenna array that includes a number of antennas and a number of transceivers associated with the number of antennas.

The transceiver 120 may be implemented on one or more baseband integrated circuits (ICs), analog ICs, radio frequency ICs (RFICs), and mixed-signal ICs. For example, the amplifier 132 through the VGA 136 in the transmitter path may be implemented on an analog IC. The mixer 138 through directional coupler 146 in the transmitter path may be implemented on an RFIC operated at mm-wave band, such as the example implementations as shown in FIGS. 3-6 to provide an on-chip impedance characterization that is fast, accurate, and low-cost. The data processor 110 may perform various functions for the wireless device 100, such as processing for transmitted and received data. A memory 112 may store program codes and data for data processor 110. The data processor 110 (which in some aspects correspond to a DSP or modem or other processor) may be implemented on one or more application specific integrated circuits (ASICs) and/or other ICs.

Figure 3:
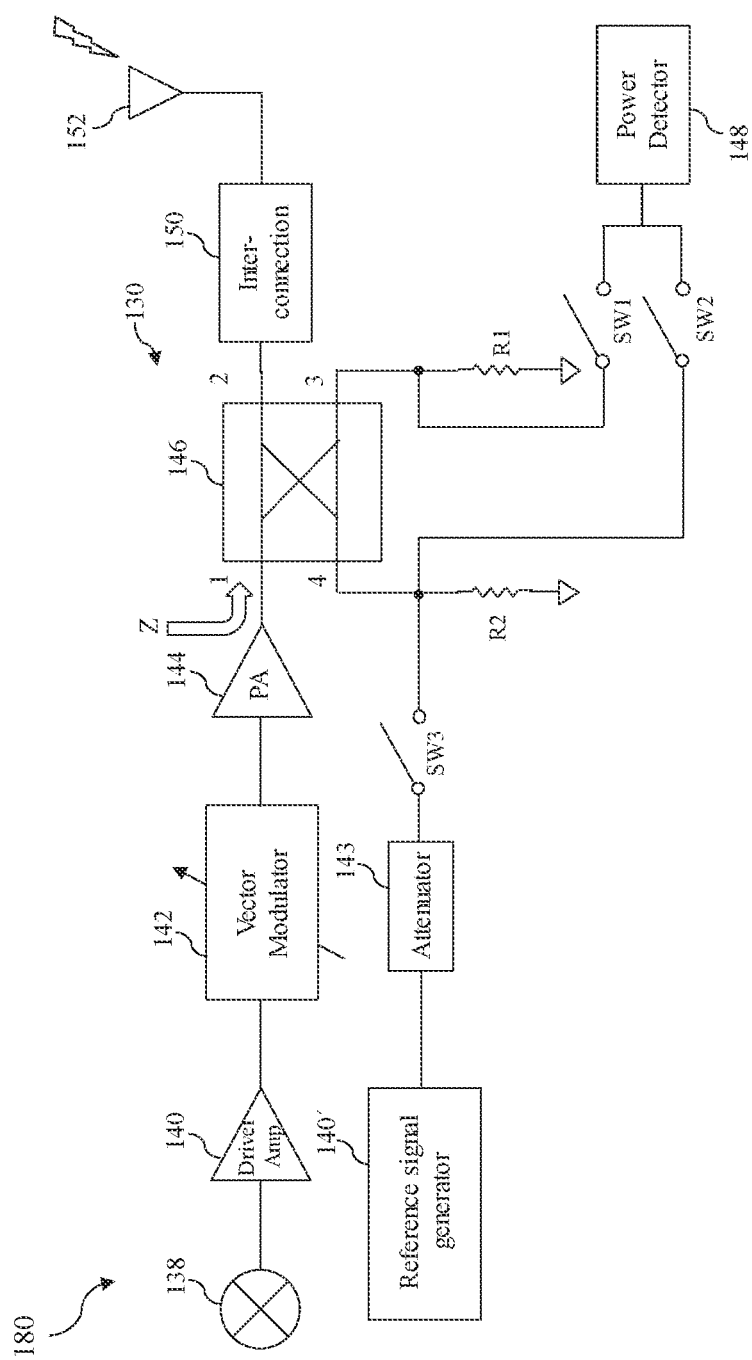
FIG. 3 is a schematic diagram illustrating one implementation of an integrated circuit operable to measure impedance presented to a transmitter path, according to aspects of the present disclosure.

FIG. 3 shows a schematic diagram of an example of a portion of an RFIC 180, which may be an implementation of part of the transmitter 130 from the mixer 138 to the directional coupler 146 in the transmitter path as shown in FIG. 2. In some aspects, the RFIC 180 is configured to a mm-wave band. The mixer 138 therefore upconverts a baseband signal to a mm-wave band. The output of the mixer 138 is coupled to the driver amplifier 140. The driver amplifier 140 amplifies the upconverted signal and is coupled to the vector modulator 142. The output of the vector modulator 142 is coupled to a power amplifier 144. The signal amplified by the power amplifier 144 is routed to the input port (Port 1) of the directional coupler 146. The through port (Port 2) of the directional coupler 146 is coupled to the antenna 152 through interconnection 150. A power detector 148 is coupled to the coupled port (Port 3) of the directional coupler 146 through a switch SW1 and also coupled to the isolation port (Port 4) of the directional coupler 146 through a switch SW2. A reference signal generator 140' is coupled to the isolation port (Port 4) of the directional coupler through an attenuator 143 and a switch SW3. Either of the switches SW1, SW2, and SW3 may be an RF switch and may be integrated on-chip in the RFIC 180.

In example implementations, the vector modulator 142 is disposed along the transmitter path to shift a phase of the upconverted signal to produce a phase-shifted signal. In a wireless device that has multiple transmitters and/or receivers, the vector modulator 142 may be particularly useful in introducing phase shifts among multiple transmitter paths for implementing antenna beam forming. The vector modulator 142 may include multiple phase shift units. A phase shifter controller selectively activates zero or more of the phase shift units at any given time. Each phase shift unit can shift an incoming signal by some different predetermined phase shift amount. By selectively activating some combination of the phase shift amounts, the vector modulator 142 can shift the signal by an amount between 0° and 360° in certain pre-defined increments, such as by an increment of 15°. However, any appropriate phase shift amount can additionally or alternatively be implemented, such as by an increment of 5° or 10°.

The signal is further amplified by the power amplifier 144. The power level of the power amplifier 144 is monitored by sampling the amplified signal at the directional coupler 146 and measuring the sampled signal by the power detector 148. The basic function of the directional coupler is to sample the input signal at a predetermined degree of coupling, with high isolation between the input signal and the sampled signal-which supports analysis and measurement of the input signal without substantially interfering the input signal. The directional coupler 146 is a 4-port device.

In the terminology of directional couplers, Port 1 is the input port and other ports are output ports, among which, Port 2 is the through port, Port 3 is the coupled port, and Port 4 is the isolation port. Impedance elements, such as Resistors R1 and R2 (or other impedance elements), are terminated at the coupled port (Port 3) and the isolation port (Port 4), respectively, providing impedance matching to these two ports.

In the example implementation, the signal amplified by the power amplifier 144 is routed to the input port (Port 1) of the directional coupler 146 as an input signal, denoted as incident wave a1, and a small fraction of the input signal is routed to the coupled port (Port 3) of the directional coupler 146, denoted as reflected wave b3. The fraction is denoted as coupling coefficient c. That is, |b3|=c*|a1|. The coupling coefficient c is determined by the design of the directional coupler 146 and usually there is c<<1. In other words, the power out of the coupled port (Port 3) is typically a small fraction of the power incident on the input port (Port 1). Accordingly, by measuring the voltage level of the output signal at the coupled port (Port 3) with an on-chip power detector 148, the voltage level of the input signal at the input port (Port 1) can be calculated as |a1|=|b3|/c. Similarly, there is |b4|=c*|b1|, where b4 is the reflected wave out of the isolation port (Port 4) and b1 is the reflected wave out of the input port (Port 1), as the directional coupler provides equally attenuated amplitudes of a1 and b1 at the coupled port (Port 3) and the isolation port (Port 4), respectively.

Figure 10:
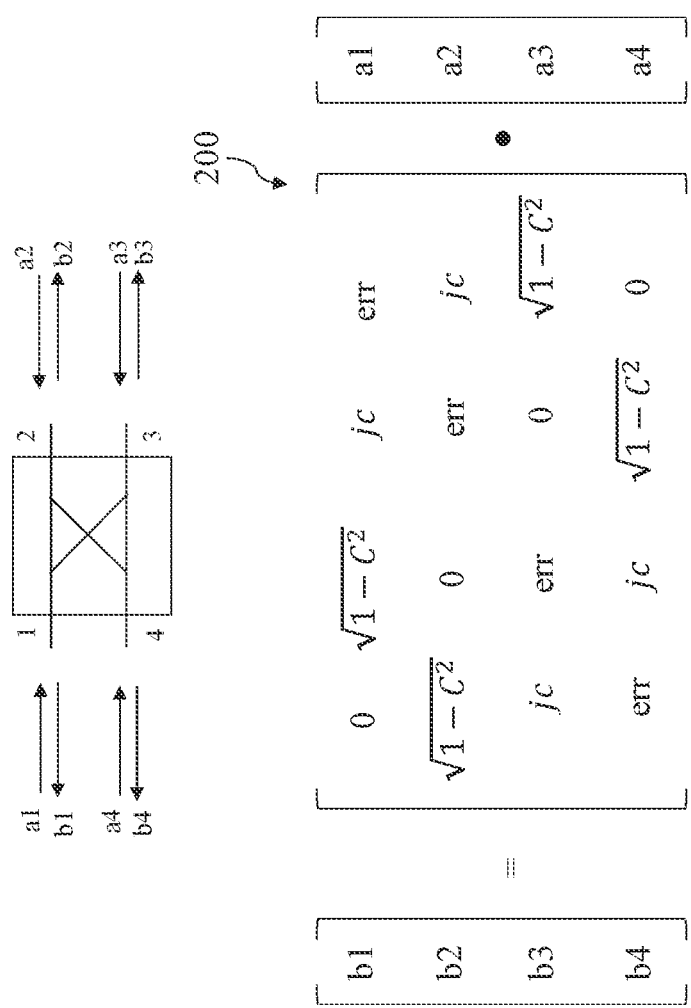
FIG. 10 is a block diagram illustrating an example directional coupler and an associated matrix of scattering parameters (s-parameters) with errors in the right diagonal of the matrix, according to aspects of the present disclosure.

Referring to FIG. 9, the definition of incident waves and reflected waves at each port of an ideal directional coupler and the numeral relationships among the incident waves and the reflected waves, represented by a scattering matrix 200, are illustrated. It is noted that an ideal directional coupler is completely characterized by the coupling coefficient c as all the scattering parameters (s-parameters) in the scattering matrix 200 are either 0, jc, or $\sqrt{1-c^2}$. For a non-ideal directional coupler, the s-parameters along the right diagonal in the scattering matrix 200 are non-zero, denoted as err, as illustrated in FIG. 10. The non-zero s-parameters represent leakages from port to port. Leakages reduce power sensing accuracy, as |b3| is no longer solely determined by c*|a1| but also leakages from other ports. Therefore, in some implementations, at least one or both of the resistors R1 and R2 are tunable to improve impedance matching at the coupled port (Port 3) and/or the isolation port (Port 4), as an effort to minimize non-zero s-parameters along the right diagonal in the scattering matrix 200.

Referring back to FIG. 3, the input port (Port 1) of the directional coupler 146 is terminated by the output impedance of the power amplifier 144, and the through port (Port 2) of the directional coupler 146 is terminated by the input impedance looking into the interconnection 150 and the antenna 152. If the RFIC 180 is under a testing environment, the antenna 152 may be replaced by a measuring port of a load-pull instrument (e.g., a VNA), which may include an intrinsic impedance of the port and an excitation AC source, and the through port (Port 2) of the directional coupler 146 in this scenario is terminated by the input impedance looking into the interconnection 150 and the measuring port of the load-pull instrument.

As discussed above, characterizing the true impedance looking into the input port (Port 1) of the directional coupler 146, denoted as Z in FIG. 3, other than indirectly deducing an impedance from an embedding two-port S2P file, may be employed for power amplifier characterization and in turn to improve circuit performance and reduce production delay. Since impedance Z and s-parameter $S_{11}$ measured at the input port (Port 1) of the directional coupler 146 has the following numeral relationship:

$$Z = 50 \times \frac{S_{11} + 1}{1 - S_{11}} \tag{1}$$

Z can be acquired by measuring $S_{11}$ at the input port (Port 1) of the directional coupler 146. $S_{11}$ is defined by a ratio of the reflected wave b1 and the incident wave a1 occurred at the input port (Port 1) of the directional coupler, which have complex values as $$S_{11} = \frac{b1}{a1} = \frac{|b1|(\cos(\emptyset_{b1}) + j\sin(\emptyset_{b1}))}{|a1|(\cos(\emptyset_{a1}) + j\sin(\emptyset_{a1}))} = \frac{|b1|}{|a1|} \times (\cos(\emptyset_{b1} - \emptyset_{a1}) + j\sin(\emptyset_{b1} - \emptyset_{a1})) \tag{2}$$

Denoting the phase difference between the reflected wave b1 and the incident wave a1 as $\emptyset_{diff}$, the expression of $S_{11}$ can be simplified as $$S_{11} = \frac{|b1|}{|a1|} \times (\cos(\emptyset_{diff}) + j\sin(\emptyset_{diff})) \tag{3}$$

That is, $S_{11}$ can be acquired by measuring a ratio of the amplitudes and a phase difference between the reflected wave b1 and the incident wave a1.

As discussed above, as the directional coupler provides equally attenuated amplitudes of a1 and b1 at the coupled port (Port 3) and the isolation port (Port 4), respectively, the measurement of a1 and b1 can be converted to the measurement of b3 and b4 as an equivalent. Particularly, there are numeral relationships of $$|b3| = c*|a1| \text{ and } |b4| = c*|b1|. \text{ Thus, } \frac{|b1|}{|a1|}$$

can be converted to a calculation $$\frac{|b4|}{|b3|}.$$

The switches SW1 and SW2 allow the power detector 148 to measure the voltage levels at the coupled port (Port 3) and the isolation port (Port 4) (thus |b3| and |b4|) in sequence. For example, the data processor 110 (FIG. 2) may first turn off the switches SW2 and SW3 (to be discussed further below) and turn on the switch SW1, allowing the power detector 148 to measure the voltage level (thus |b3|) at the coupled port (Port 3). Next, the data processor 110 may turn off the switches SW1 and SW3 and turn on the switch SW2, allowing the power detector 148 to measure the voltage level (thus |b4|) at the isolation port (Port 4). The data processor 110 records the amplitudes of |b3| and |b4| measured by the power detector 148 and calculates the ratio $$\frac{|b4|}{|b3|},$$

which is equivalent to the ratio $$\frac{|b1|}{|a1|}.$$

Thus, the amplitude of $S_{11}$ is acquired. How to acquire the phase of $S_{11}$ is further explained below.

As shown in Equation (3), the phase of the complex value of $S_{11}$ is independent of absolute phase of either the reflected wave b1 or the incident wave a1, but instead depends on the difference in phase between the reflected wave b1 and the incident wave a1. As the directional coupler provides the reflected waves b3 and b4 of equally attenuated amplitudes of a1 and b1, respectively, the phases of the reflected waves b3 and b4 also tracks a1 and b1, respectively. That is, measuring phase difference between the incident wave a1 and the reflected wave b1 can be converted to measuring phase difference between the reflected waves b3 and b4 from the coupled port (Port 3) and the isolation port (Port 4). Yet, the power detector 148 has the limitation of measuring voltage level not phase. If the reflected waves b3 and b4 both can be referenced to a reference signal and there is a way to measure a first phase difference between the reflected wave b3 and the reference signal and a second phase difference between the reflected wave b4 and the reference signal, the phase difference between the reflected waves b3 and b4 can be calculated from the delta between the first phase difference and the second phase difference.

Still referring to FIG. 3, the RFIC 180 includes a reference signal generator 140' operable to generate a signal referenced to the signal in the transmitter path. The signal from the reference signal generator 140' is also referred to as a reference signal. The reference signal generated from the reference signal generator 140' is coherent with the signal in the transmitter path. The term "coherent" in the present example refers to two signals that have substantially the same waveform, but may differ in amplitude or phase. In some implementations, the reference signal generator 140' is an extra driver amplifier with an input coupled to the output of the mixer 138. In such implementations, the reference signal generator 140' may also be referred to as the driver amplifier 140'. Since both the driver amplifiers 140 and 140' receive input from the same port of the mixer 138, the signal in the transmitter path and the reference signal from the driver amplifier 140' are coherent. The reference signal generator 140' is coupled to the isolation port (Port 4) of the directional coupler 146 through the switch SW3. In some implementations, the reference signal generator 140' is first coupled to an attenuator 143 (or a voltage divider, such as a resist ladder) to adjust the amplitude of the reference signal before coupled to the isolation port (Port 4). The attenuator 143 may be positioned before or after the switch SW3.

When the switches SW2 and SW3 are turned on and the switch SW1 is turned off, the power detector 148 measures output level at the isolation port (Port 4), which is a voltage level of a combined signal of the reference signal from the reference signal generator 140' and the reflected wave b4. Meanwhile, the vector modulator 142 is sweeping the phase shift amount between 0° and 360° with a pre-defined increment, such as by an increment of 5°. The phase of the incident wave a1 is accordingly sweeping between 0° and 360° with the pre-defined increment, and so does the phase of the reflected wave b4. Since the reference signal from the reference signal generator 140' and the reflected wave b4 originate from the same output of the mixer 138, they are coherent.

For two coherent signals, when the two phases are aligned, it is a coherent addition of the two amplitudes and a peak shows up; when the two phases are opposite, it is a coherent subtraction of the two amplitudes and a valley shows up due to the cancelation of the two signals. The power detector 148 sends the voltage levels of the combined signal at each phase shift setting to the data processor 110. The data processor 110 constructs a curve of the combined signal amplitude versus the phase shifting introduced by the vector modulator 142. Alternatively, the data processor 110 may construct a table to record an equivalent of the curve.

Figure 11:
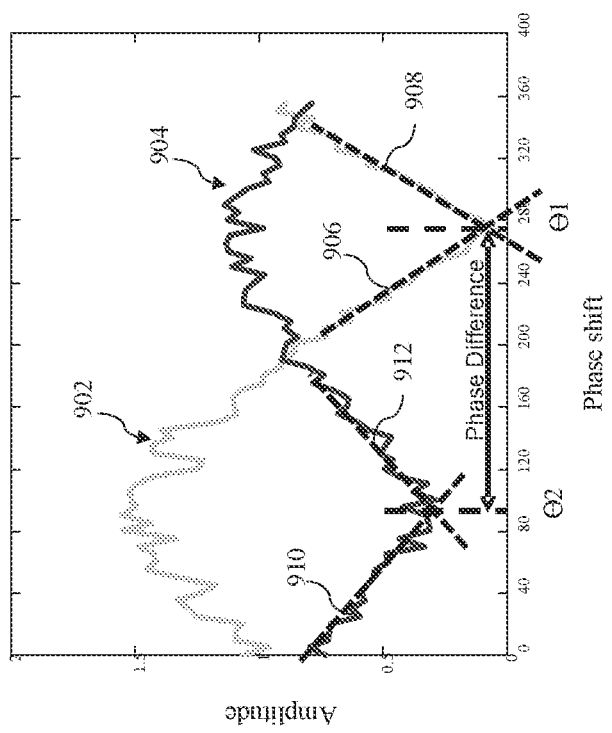
FIG. 11 is a diagram illustrating waveforms of voltage levels versus phase shift sweeping acquired by an on-chip power detector at an isolation port and a coupled port of a directional coupler, according to aspects of the present disclosure.

FIG. 11 illustrates an example curve 902 which is the voltage level of the combined signal measured at the isolation port (Port 4) versus a phase shift sweeping at an increment of 5°. To identify the position of a valley (or a peak), denoted as θ1 in FIG. 11, the data processor 110 may run through each point recorded and retrieve the absolute minimum (or maximum) value. When there is noise on the curve that may interfere the absolute minimum (or maximum) value, such as due to the phase dependent amplitude adjustment from the vector modulator 142, other methods may be implemented to help identifying the position of a valley (or a peak). FIG. 11 illustrates how to interpolate the data points on the curve with two dash lines 906 and 908 that represent slopes of the curve and identify where the slopes of the curve intersect as the position θ1. Alternatively, the data processor 110 may use gradient search to identify the position θ1 of a valley (or a peak).

When the switches SW1 and SW3 are turned on and the switch SW2 is turned off, the power detector 148 measures output level at the coupled port (Port 3), which is a voltage level of a combined signal of the reference signal from the reference signal generator 140' (through the path from Port 4 to Port 3) and the reflected wave b3. Meanwhile, the vector modulator 142 is sweeping the phase shift amount between 0° and 360° with a pre-defined increment, such as by an increment of 5°. The phase of the incident wave a1 is accordingly sweeping between 0° and 360° with the pre-defined increment, and so does the phase of the reflected wave b3. Since the reference signal from the reference signal generator 140' and the reflected wave b3 originate from the same output of the mixer 138, they are coherent. For two coherent signals, when the two phases are aligned, it is a coherent addition of the two amplitudes and a peak shows up; when the two phases are opposite, it is a coherent subtraction of the two amplitudes and a valley shows up due to the cancelation of the two signals.

The power detector 148 sends the voltage level of the combined signal at each phase shift setting to the data processor 110. The data processor 110 constructs a curve of the combined signal amplitude versus the phase shifting introduced by the vector modulator 142. Alternatively, the data processor 110 may construct or store a table to record an equivalent of the curve. FIG. 11 illustrates an example curve 904 which is the voltage level of the combined signal measured at the coupled port (Port 3) versus a phase shift sweeping at an increment of 5°. To identify the position of a valley (or a peak), denoted as θ2 in FIG. 11, the data processor 110 may run through each point recorded and retrieve the absolute minimum (or maximum) value. When there is noise on the curve that may interfere the absolute minimum (or maximum) value, such as due to the phase dependent amplitude adjustment from the vector modulator 142, other methods may be implemented to help identifying the position of a valley (or a peak). FIG. 11 illustrates how to interpolate the data points on the curve with two dash lines 910 and 912 that represent slopes of the curve and identify where the slopes of the curve intersect as the position θ2. Alternatively, the data processor 110 may use gradient search to identify the position θ2 of a valley (or a peak).

Still referring to FIG. 11, the reflected wave b4 has a relative phase shifting θ1 referenced to the reference signal and the reflected wave b3 has a relative phase shifting θ2 referenced to the reference signal. Accordingly, a phase difference between the reflected waves b3 and b4 is represented by θ1-θ2. At this step, the amplitude and the phase of $S_{11}$ are both acquired, and the impedance Z (FIG. 3) presented to the transmitter path can be calculated based on Equation (1).

Figure 4:
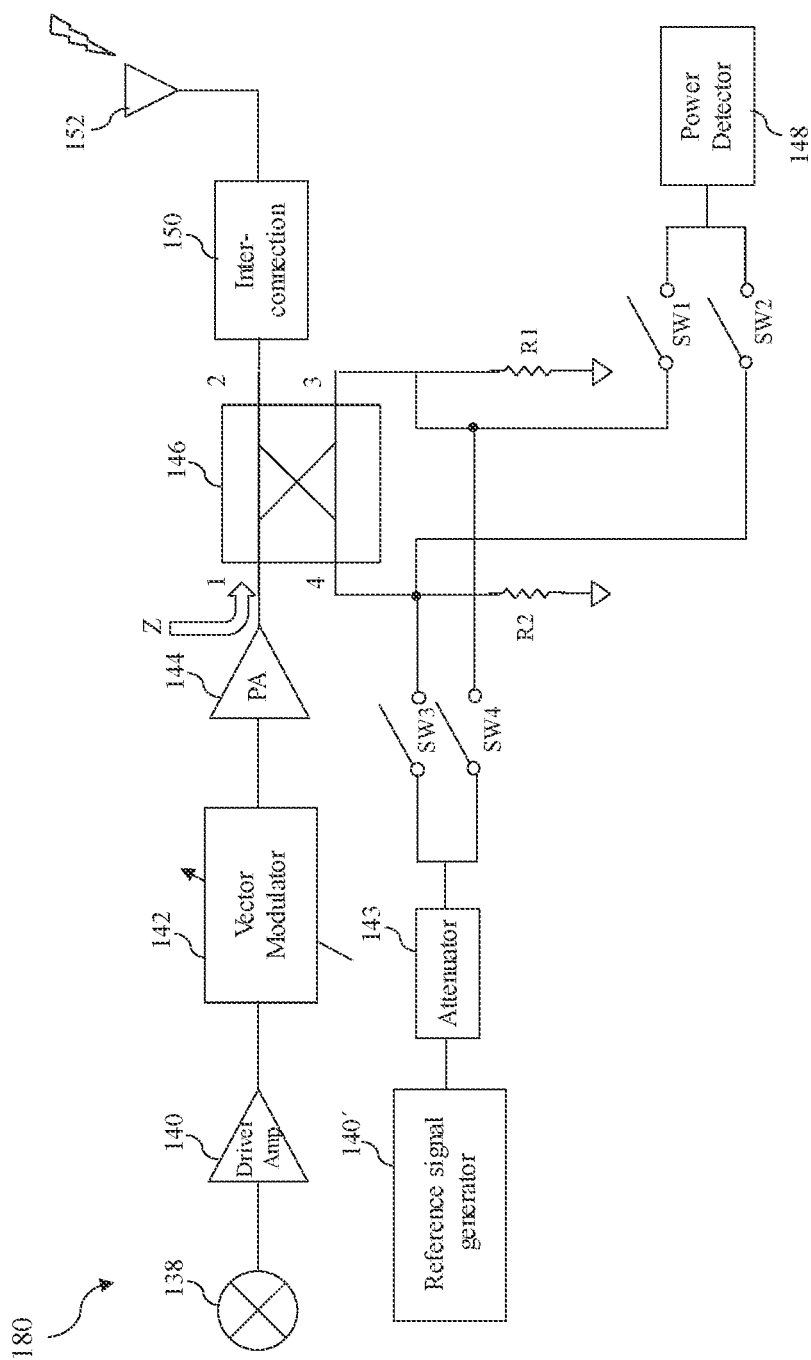
FIG. 4 is a schematic diagram illustrating another implementation of an integrated circuit operable to measure impedance presented to a transmitter path, according to aspects of the present disclosure.

To be noted, when the power detector 148 measures output level at the coupled port (Port 3), the reference signal from the reference signal generator 140' has traveled through a path inside the directional coupler 146 from Port 4 to Port 3. To more accurately identifying the position θ2 of a valley (or a peak), the extra phase delay along the path from Port 4 to Port 3 can be de-embedded. Yet, although there may be a non-ideal nature of a directional coupler implementation that the outputs of the coupled and isolated ports differ by the propagation delay incurred by the physical length of a directional coupler, a propagation delay of a signal from the isolation port to the coupled port generally equates to the internal propagation delay of a directional coupler thus canceling the non-deal nature of the directional coupler implementation. That is, having the power detector 148 measure the output level at the coupled port (Port 3) can still achieve a satisficed level of accuracy. Nonetheless, in an alternative implementation as shown in FIG. 4, an extra switch SW4 allows the reference signal from the driver amplifier 140' to couple to the coupled port (Port 3) of the directional coupler 146 without traveling from Port 4 to Port 3. When the switches SW2 and SW3 are turned on and the switches SW1 and SW4 are turned off, the power detector 148 measures the output level at the isolation port (Port 4), which is a voltage level of a combined signal of the reference signal from the driver amplifier 140' and the reflected wave b4; when the switches SW2 and SW3 are turned off and the switches SW1 and SW4 are turned on, the power detector 148 measures output level at the coupled port (Port 3), which is a voltage level of a combined signal of the reference signal from the reference signal generator 140' and the reflected wave b3. Since the reference signal from the reference signal generator 140' is tapped on the Port 3 directly, there may be no need to de-embed the extra phase delay along the path from Port 4 to Port 3 under this implementation.

Figure 5:
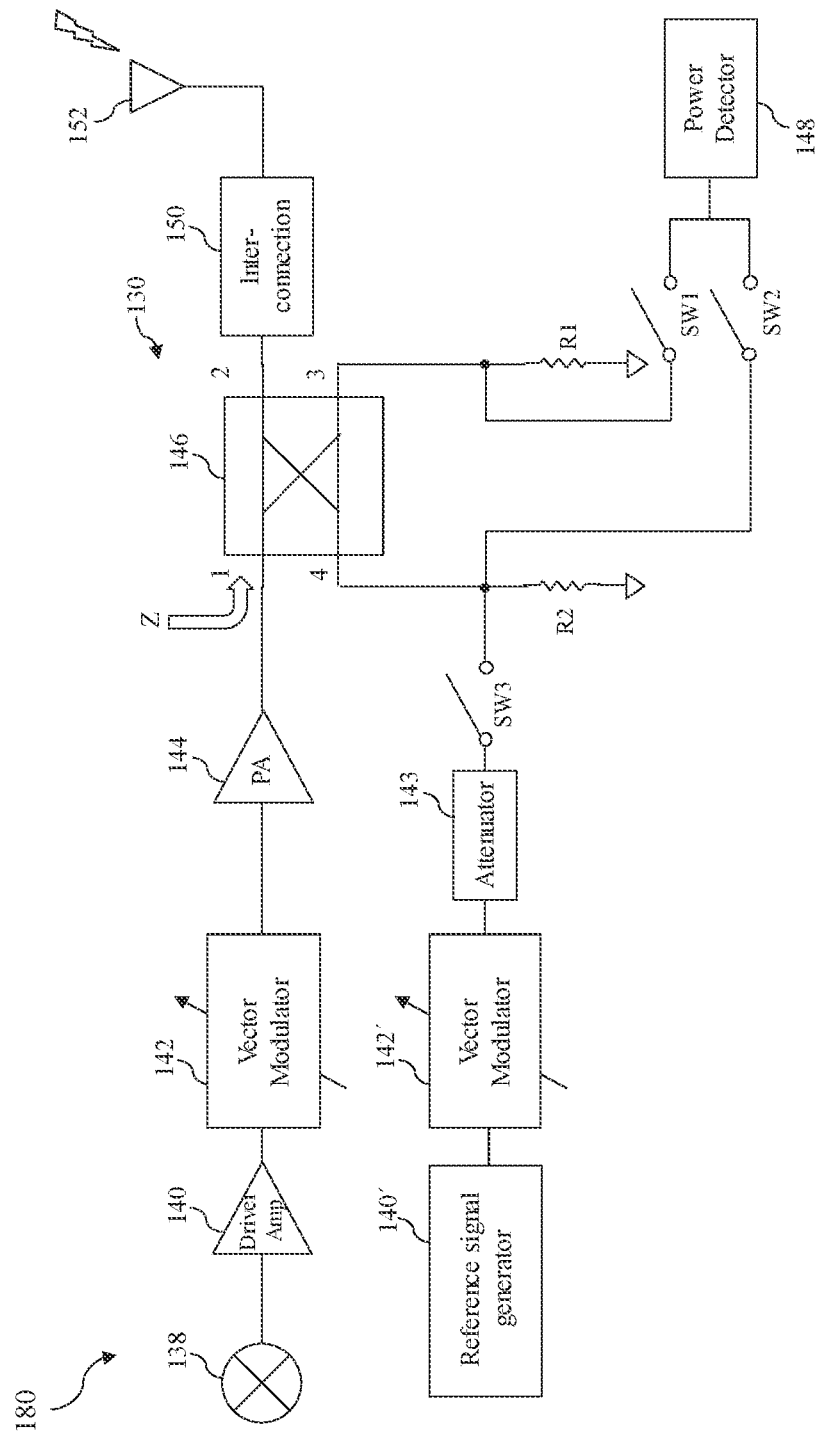
FIG. 5 is a schematic diagram illustrating another implementation of an integrated circuit operable to measure impedance presented to a transmitter path, according to aspects of the present disclosure.
Figure 6:
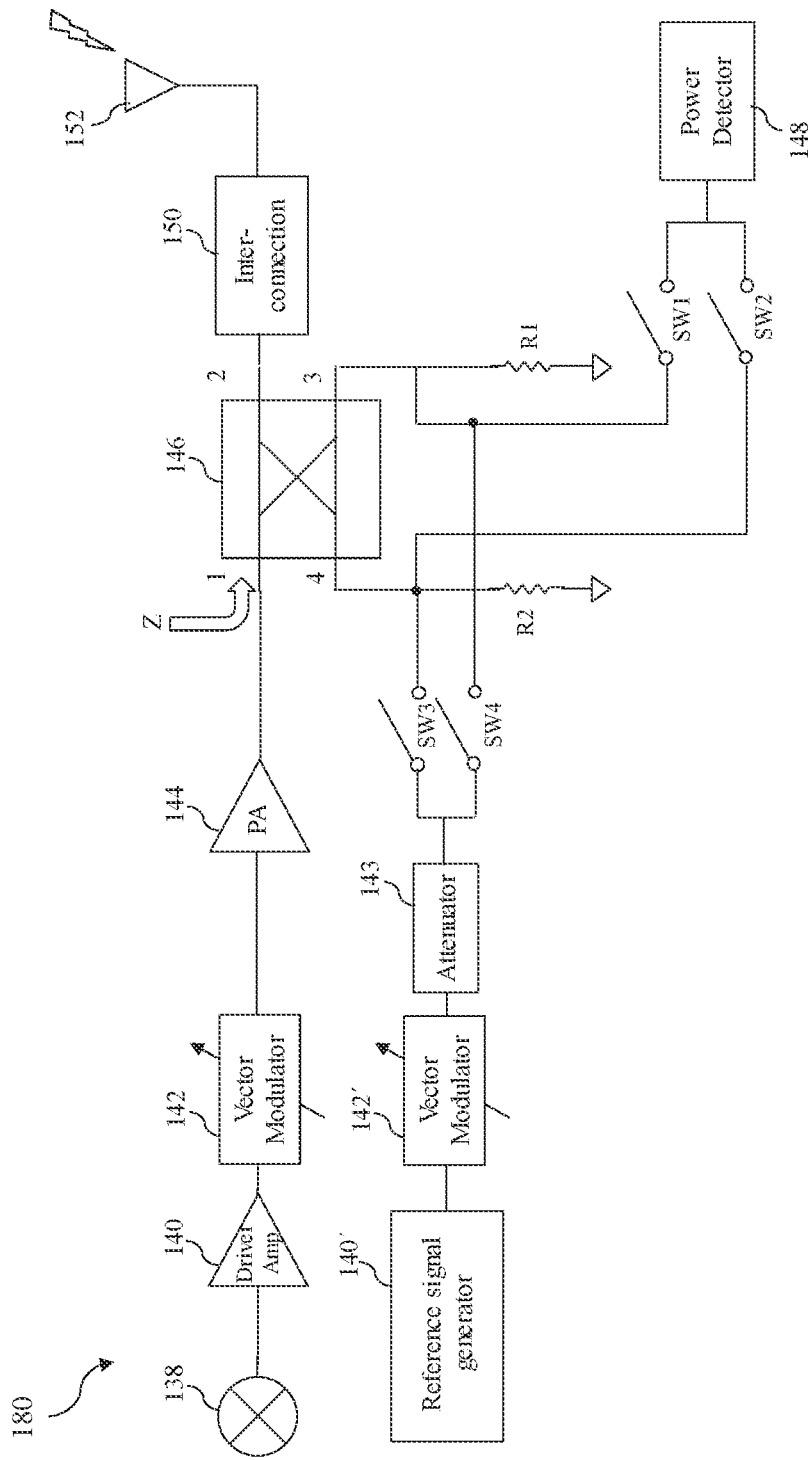
FIG. 6 is a schematic diagram illustrating another implementation of an integrated circuit operable to measure impedance presented to a transmitter path, according to aspects of the present disclosure.

Regarding the implementations illustrated in FIGS. 3 and 4, the vector modulator 142 in the transmitter path provides the phase shift sweeping. That means during the impedance characterization, the transmitter path may pause or transition from a normal working mode and enter a characterization mode. Alternatively, the reference signal path may include an extra vector modulator for phase shift sweeping the reference signal from the reference signal generator 140', such as shown in FIGS. 5 and 6. FIGS. 5 and 6 are implementations based on the ones illustrated in FIGS. 3 and 4, respectively, with an extra vector modulator 142' coupled to the output of the reference signal generator 140'. With the extra vector modulator 142', the phase shift sweeping can be implemented in the reference signal path without a need of transitioning the transmitter path under characterization from a normal working mode.

Figure 7:
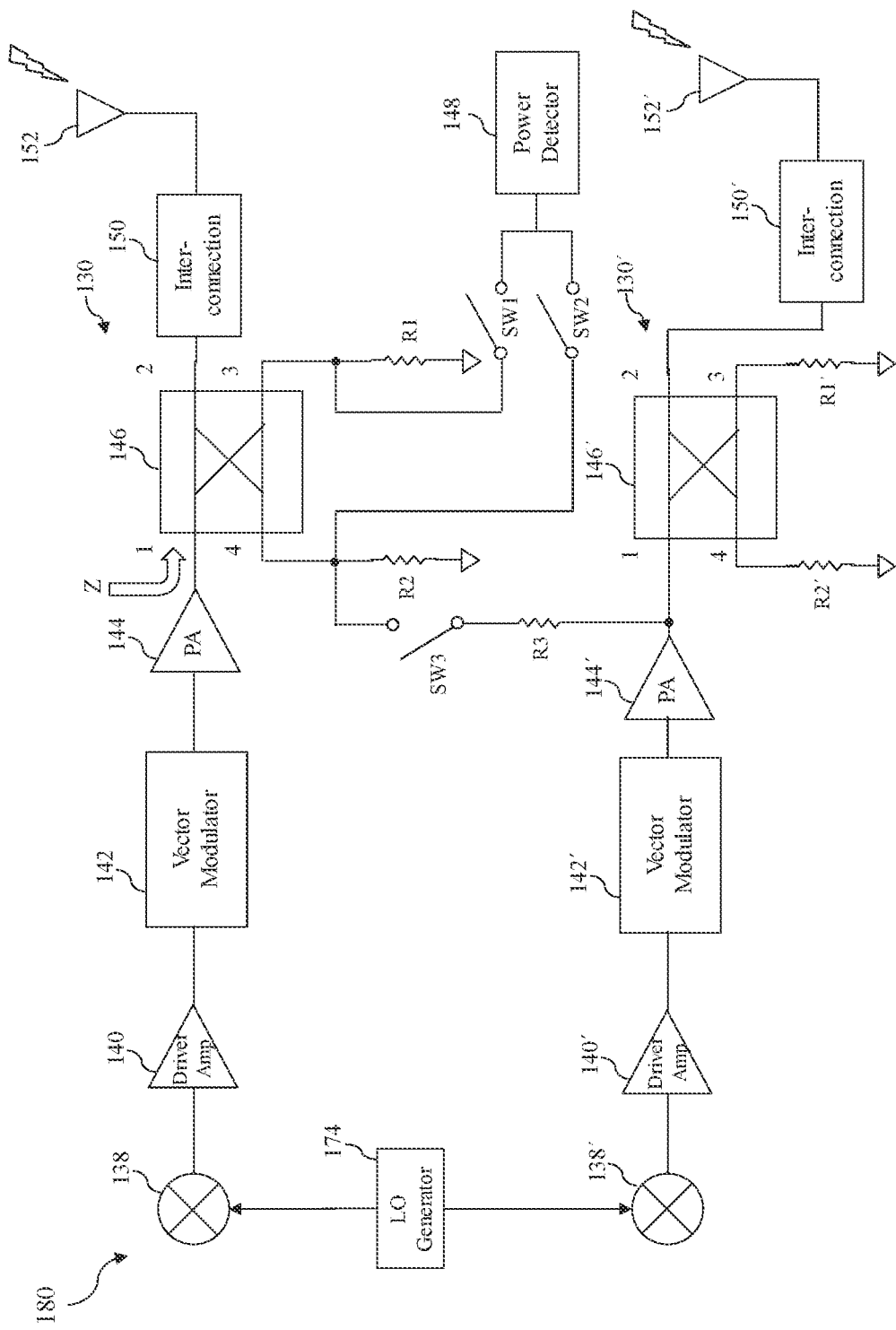
FIG. 7 is a schematic diagram illustrating another implementation of an integrated circuit operable to measure impedance presented to a transmitter path, according to aspects of the present disclosure.

Reference is now made to FIG. 7. FIG. 7 shows a schematic diagram of another implementation of an example design of an RFIC 180, which may be an implementation of part of the transmitter 130 as from the mixer 138 to the directional coupler 146 in the transmitter path as shown in FIG. 2. For reasons of clarity and consistency, similar elements appearing in FIGS. 3 and 7 are labeled the same, and the details of these elements are not necessarily repeated again below. Different from the implementation in FIG. 3, the implementation in FIG. 7 includes a second transmitter 130' neighboring the first transmitter 130, which provides a reference signal and a vector modulator coupled to the directional coupler in the first transmitter 130. The components in the second transmitter 130' include a mixer 138', a driver amplifier 140', a vector modulator 142', a power amplifier 144', a directional coupler 146' coupled to an antenna 152' (or a testing equipment, such as a VNA) through the interconnection 150', and resistors R1' and R2' providing termination to ports of the directional coupler 146', which are substantially the same to their respective counterparts in the transmitter 130. Both the transmitters 130 and 130' are operable in normal working modes, for example, collectively providing beam forming for an antenna array that includes the antennas 152 and 152'.

The output of the power amplifier 144' is coupled to the input port (Port 1) of the directional coupler 146' and also coupled to the isolation port (Port 4) of the directional coupler 146 through a resistor R3 (or a voltage divider, such as a resistor ladder) and a switch SW3. The resistor R3 adjusts the amplitude from the output of the power amplifier 144' before coupled to the isolation port (Port 4) of the directional coupler 146. Although the power amplifier 144' has its own signal source from the mixer 138', the data processor 110 may generate the same data stream for the two transmitter paths, and the same LO generator 174 may be shared by the mixers 138 and 138', such that the reference signal output from the power amplifier 144' is still coherent with the signal output from the power amplifier 144. Alternatively, the driver amplifier 140 and the driver amplifier 140' may be configured to share the output from the same mixer to ensure the signals in the two transmitter paths are coherent. For example, the input of the driver amplifier 140' may be disconnected from the mixer 138' by a switch (not shown) and tapping to the output of the mixer 138 by another switch (not shown). The directional coupler 146 allows the impedance characterization to be performed by measuring the voltage levels at the Port 3 and Port 4 without interfering with the normal working function of the transmitter 130. Thus, the impedance characterization can be performed on-the-fly during the normal operation of the transmitter 130.

During the impedance characterization, the switch SW3 is first turned off and the switches SW1 and SW2 are turned on in turns. The power detector 148 measures the voltage level at the coupled port (Port 3) (thus |b3|) and the voltage level at the isolation port (Port 4) (thus |b4|). The data processor 110 records the amplitudes of |b3| and |b4| measured by the power detector 148 and calculates the ratio |b4|/|b3|, which is equivalent to the ratio |b1|/|a1|. Thus, the amplitude of $S_{11}$ is acquired. Next, the switches SW1 is turned off and the switches SW2 and SW3 are turned on to introduce the reference signal to the isolation port (Port 4). Meanwhile the vector modulator 142' is sweeping the phase shift amount between 0° and 360° with a pre-defined increment, such as by an increment of 5°. Position θ1 of a valley (or a peak) of a combined signal at the isolation port (Port 4) is acquired (FIG. 11). Next, the switch SW2 is turned off and the switches SW1 and SW3 are turned on to introduce the reference signal to the coupled port (Port 3). Meanwhile the vector modulator 142' is sweeping the phase shift amount between 0° and 360° with a pre-defined increment, such as by an increment of 5°. Position θ2 of a valley (or a peak) of a combined signal at the coupled port (Port 3) is acquired (FIG. 11). Accordingly, a phase difference between the reflected waves b3 and b4 is represented by θ1-θ2. At this step, the amplitude and the phase of $S_{11}$ are both acquired, and the impedance Z presented to the transmitter path 130 can be calculated based on Equation (1).

Figure 8:
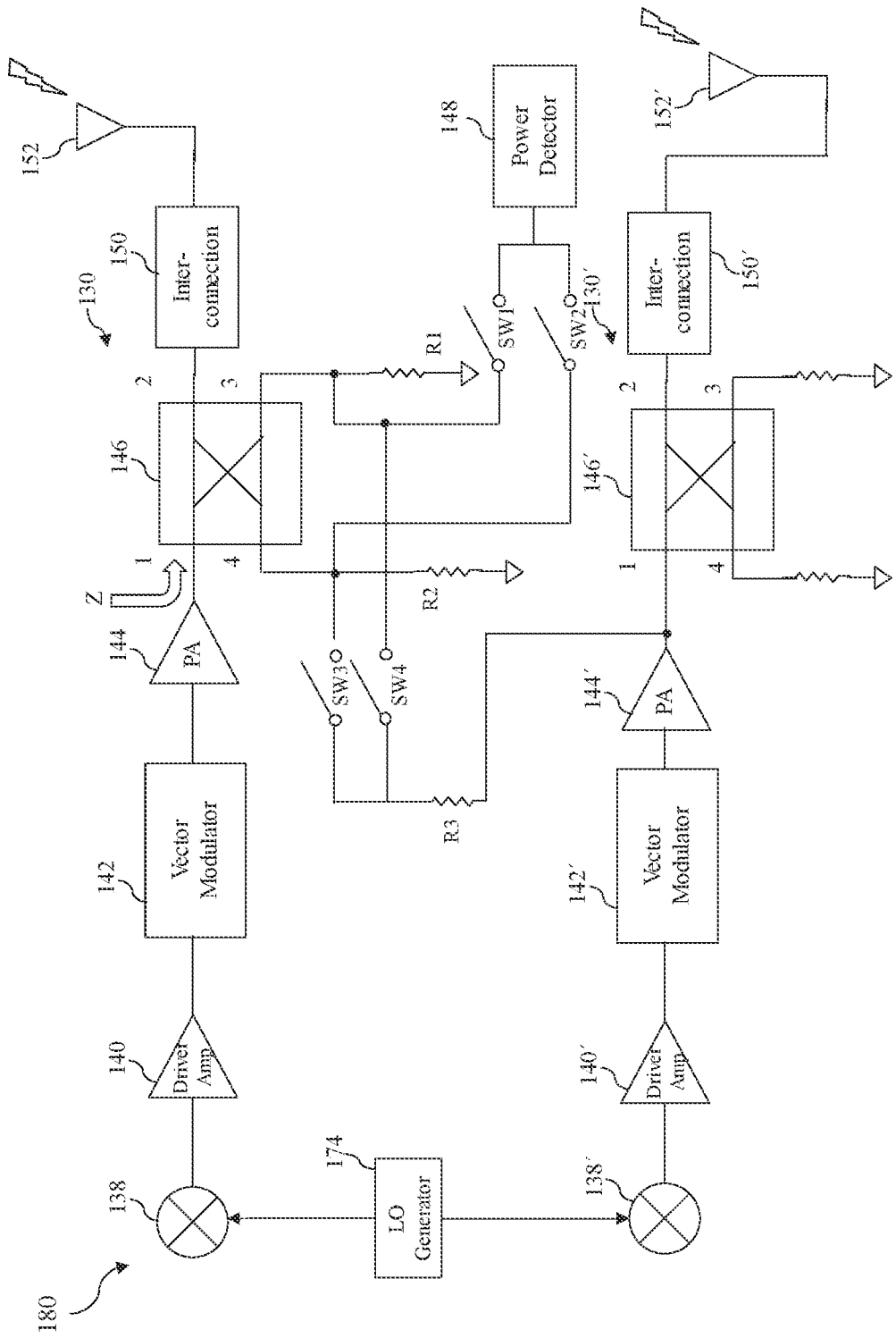
FIG. 8 is a schematic diagram illustrating yet another implementation of an integrated circuit operable to measure impedance presented to a transmitter path, according to aspects of the present disclosure.

To be noted, in the implementation as illustrated in FIG. 7, when the power detector 148 measures the output level at the coupled port (Port 3), the reference signal from the power amplifier 144' has traveled through a path inside the directional coupler 146 from Port 4 to Port 3. To more accurately identifying the position θ2 of a valley (or a peak), the extra phase delay along the path from Port 4 to Port 3 can be de-embedded. Yet, although there may be a non-ideal nature of a directional coupler implementation that the outputs of the coupled and isolated ports differ by the propagation delay incurred by the physical length of a directional coupler, a propagation delay of a signal from the isolation port to the coupled port generally equates to the internal propagation delay of a directional coupler thus canceling the non-deal nature of the directional coupler implementation. That is, having the power detector 148 measure the output level at the coupled port (Port 3) can still achieve a satisficed level of accuracy. Nonetheless, in an alternative implementation as shown in FIG. 8, an extra switch SW4 allows the reference signal from the power amplifier 144' to couple to the coupled port (Port 3) of the directional coupler 146 without traveling from Port 4 to Port 3. When the switches SW2 and SW3 are turned on and the switches SW1 and SW4 are turned off, the power detector 148 measures output level at the isolation port (Port 4), which is a voltage level of a combined signal of the reference signal from the power amplifier 144' and the reflected wave b4; when the switches SW2 and SW3 are turned off and the switches SW1 and SW4 are turned on, the power detector 148 measures output level at the coupled port (Port 3), which is a voltage level of a combined signal of the reference signal from the power amplifier 144' and the reflected wave b3. Since the reference signal from the power amplifier 144' is tapped on the Port 3 directly, there may be no need to de-embed the extra phase delay along the path from Port 4 to Port 3 under this implementation.

The two transmitter paths in the RFIC 180 in the implementations illustrated in FIGS. 7 and 8 are for illustration purposes and do not necessarily limit the implementations of the present disclosure to any number of transmitter paths. In various implementations, the RFIC 180 may include more than two transmitters in one of the transmitter paths or any one of the transmitter paths can be used to provide a reference signal and a vector modulator for impedance characterization in other transmitter paths.

In the present disclosure, on-chip impedance characterization is employed in various implementations of the RFIC 180. Particularly at mm-wave bands, a direct characterization of the impedance presented to ports of an IC by using on-chip components mitigates the otherwise complex and high-cost methods relying on sophisticated equipment and provides a fast, accurate, and low-cost solution instead.

Figure 12:
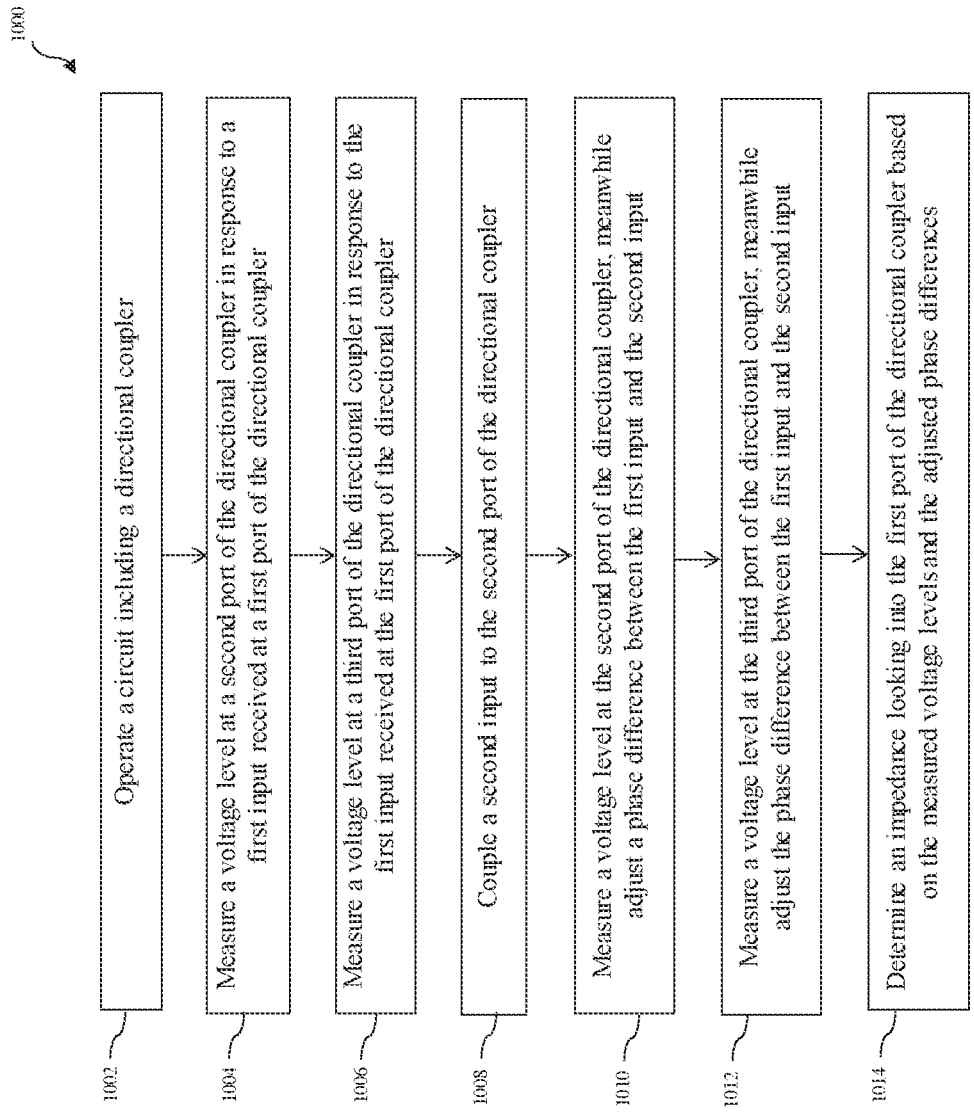
FIG. 12 is a flow chart illustrating an example method of measuring impedance presented to a transmitter path of an integrated circuit using on-chip components, in accordance with an implementation.

Reference is now made to FIG. 12. FIG. 12 illustrates a flow chart of a method 1000 of measuring impedance presented at a transmitter (or transceiver) path by using on-chip components functioning similar to a network analyzer. The method 1000 may be implemented, in whole or in part, by implementations of the wireless device 100 discussed above at FIGS. 2-8. It is understood that additional operations can be provided before, during, and after the method 1000, and some operations described can be replaced, eliminated, or moved around for additional implementations of the methods. The method 1000 is merely exemplary, and is not intended to limit the present disclosure beyond what is explicitly recited in the claims.

At operation 1002, the method 1000 operates a circuit that includes a directional coupler. The directional coupler has four ports. At operation 1004, a voltage level at a second port of the directional coupler is measured in response to a first input received at a first port of the directional coupler. In some implementations, the first input is a signal from a power amplifier. At operation 1006, a voltage level at a third port of the directional coupler is measured in response to the first input received at a first port of the directional coupler. At operation 1008, a second input is coupled to the second port of the directional coupler. In some implementations, the second input is a reference signal that is coherent with the signal from the power amplifier. At operation 1010, a voltage level at the second port of the directional coupler is measured, meanwhile a phase difference between the first input and the second input is adjusted. At operation 1012, a voltage level at the third port of the directional coupler is measured, meanwhile the phase difference between the first input and the second input is adjusted. At operation 1014, an impedance looking into the first port of the directional coupler is determined based on the measured voltage levels and the adjusted phase differences.

Figure 13:
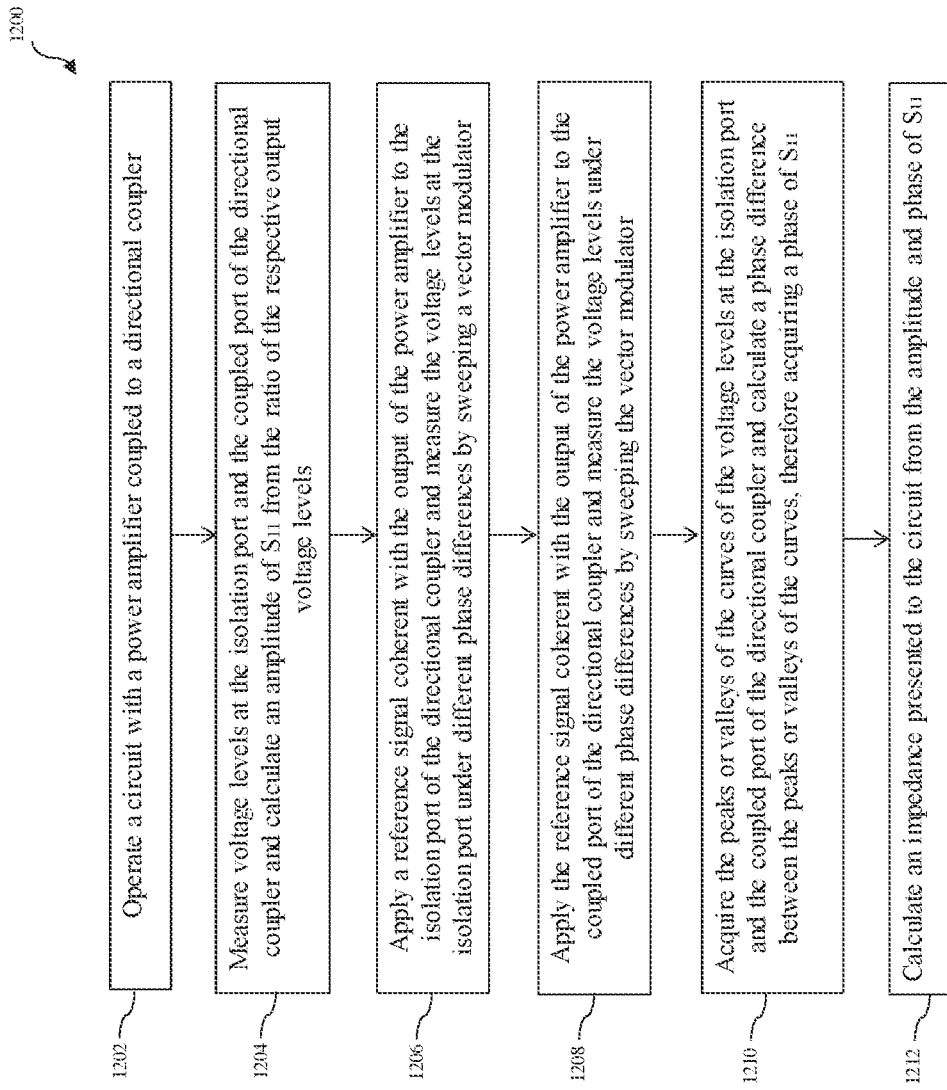
FIG. 13 is a flow chart illustrating another example method of measuring impedance presented to a transmitter path of an integrated circuit using on-chip components, in accordance with an implementation.

Reference is now made to FIG. 13. FIG. 13 illustrates another flow chart of a method 1200 of measuring impedance presented at a transmitter (or transceiver) path by using on-chip components functioning similar to a network analyzer. The method 1200 may be implemented, in whole or in part, by implementations of the wireless device 100 discussed above at FIGS. 2-8. It is understood that additional operations can be provided before, during, and after the method 1200, and some operations described can be replaced, eliminated, or moved around for additional implementations of the methods. The method 1200 is merely exemplary, and is not intended to limit the present disclosure beyond what is explicitly recited in the claims.

At operation 1202, the method 1000 operates a circuit with at least a transmitter (or a transceiver). The transmitter includes a power amplifier coupled to an input port of a directional coupler. At operation 1204, an on-chip power detector measures in turns voltage levels (or power levels) at a coupled port and an isolation port of the directional coupler. From the ratio of the voltage levels, the circuit deduces an amplitude of an $S_{11}$ parameter looking into the input port of the directional coupler. At operation 1206, a reference signal that is coherent with the signal from the transmitter is applied to the isolation port of the directional coupler. Meanwhile, a vector modulator sweeps a phase difference between the reference signal and the signal from the transmitter. The power detector records a first curve of the combined signal at the isolation port versus the phase difference sweeping. The vector modulator may be in the transmitter path or out of the transmitter path. At operation 1208, the reference signal that is coherent with the signal from the transmitter is applied to the coupled port of the directional coupler. Meanwhile, the vector modulator sweeps a phase difference between the reference signal and the signal from the transmitter. The power detector records a second curve of the combined signal at the coupled port versus the phase difference sweeping. At operation 1210, valleys (or peaks) of the two curves are identified, the difference between the two valleys (or peaks) represents a phase difference between an incident wave and a reflected wave at the input port of the directional coupler, which equals a phase of the $S_{11}$ parameter. At operation 1212, the $S_{11}$ parameter can be calculated from the acquired amplitude and phase.

Accordingly, an impedance presented to the transmitter path can be calculated from the $S_{11}$ parameter. Knowing the impedance presented to the transmitter path allows the impedance of the power amplifier itself be accurately characterized and also allows control circuits to predistort signals into the power amplifier to compensate the imperfectly matched impedance presented to the transmitter path.

Various implementations are described by the clauses below:

1. A circuit, comprising:
 a directional coupler having an input port, a through port, a coupled port, and an isolation port;
 a power amplifier coupled to the input port of the directional coupler;
 a power detector configured to measure output levels from the coupled port and the isolation port of the directional coupler;
 a reference signal generator coupled to the isolation port of the directional coupler; and a vector modulator configured to adjust a phase of a signal generated from the
 power amplifier.
2. The circuit of clause 1, wherein the signal generated from the power amplifier and a reference signal generated from the reference signal generator are coherent.
3. The circuit of clauses 1-2, wherein the vector modulator is coupled to the power amplifier.
4. The circuit of clauses 1-3, wherein the reference signal generator is coupled to the isolation port of the directional coupler through a first switch.
5. The circuit of clause 4, wherein the reference signal generator is also coupled to the coupled port of the directional coupler through a second switch.
6. The circuit of clauses 1-2 and 4, wherein the power amplifier is a first power amplifier, further comprising:
 a second power amplifier, wherein the reference signal generator is coupled to the isolation port of the directional coupler through the vector modulator and the second power amplifier.
7. The circuit of clause 6, wherein the second power amplifier is coupled to the isolation port of the directional coupler through a resistor and a first switch.
8. The circuit of clause 7, wherein the resistor is also coupled to the coupled port of the directional coupler through a second switch.
9. The circuit of clauses 1-8, further comprising:
 a first impedance element coupled to the isolation port of the directional coupler; and
 a second impedance element coupled to the coupled port of the directional coupler.
10. The circuit of clause 9, wherein at least one of the first and second impedance elements is tunable.
11. The circuit of clauses 1-3, further comprising:
 a mixer, wherein the power amplifier and the reference signal generator are coupled to a same output of the mixer.
12. The circuit of clause 11, wherein the power detector is coupled to the coupled port of the directional coupler through a first switch and coupled to the isolation port of the directional coupler through a second switch.
13. An integrated circuit, comprising:
 a first transmitter path that comprises a first vector modulator, a first power amplifier, a first directional coupler, and a power detector coupled to two ports of the first directional coupler; and
 a second transmitter path that comprises a second vector modulator, a second power amplifier, wherein the second power amplifier is coupled to at least one of the two ports of the first directional coupler.
14. The integrated circuit of clause 13, wherein the power detector is configured to measure output levels from the two ports of the first directional coupler in sequence.
15. The integrated circuit of clauses 13-14, wherein the first and second power amplifiers are configured to generate signals that are coherent.
16. The integrated circuit of clause 15, wherein the first and second vector modulators are configured to create a sweep of phase differences between the signals generated by the first and second power amplifiers.
17. The integrated circuit of clauses 13-15, wherein the first power amplifier is coupled to an input port of the first directional coupler, the second power amplifier is coupled to an isolation port of the first directional coupler, and the power detector is coupled to a coupled port and the isolation port of the first directional coupler.
18. The integrated circuit of clause 17, wherein the second power amplifier is also coupled to the coupled port of the first directional coupler.
19. The integrated circuit of clauses 13-15, further comprising:

a second directional coupler, wherein the second power amplifier is coupled to the second directional coupler.

20. The integrated circuit of clauses 13-15, wherein the second power amplifier is coupled to the first directional coupler through a switch.

21. A method of measuring impedance presented to a port of an integrated circuit, the integrated circuit including a directional coupler, the method comprising:

measuring a voltage level at a second port of the directional coupler in response to a first input received at a first port of the directional coupler; measuring a voltage level at a third port of the directional coupler in response to the first input received at the first port of the directional coupler;

coupling a second input to the second port of the directional coupler;

measuring a voltage level at the second port of the directional coupler while adjusting a phase difference between the first input and the second input;

measuring a voltage level at the third port of the directional coupler while adjusting the phase difference between the first input and the second input; and determining an impedance looking into the first port of the directional coupler based on the measured voltage levels and the adjusted phase differences.

22. The method of clause 21, wherein the determining of the impedance includes calculating an amplitude of an s-parameter by calculating a ratio of the voltage level at the second port and the voltage level at the third port prior to the coupling of the second input.

23. The method of clauses 21-22, wherein the determining of the impedance includes calculating a phase of an s-parameter, and wherein the calculating of the phase of the s-parameter includes:

identifying a first value of the phase difference corresponding to a peak or a valley of the voltage level measured at the second port of the directional coupler;

identifying a second value of the phase difference corresponding to a peak or a valley of the voltage level measured at the third port of the directional coupler; and calculating the phase of the s-parameter based on a difference between the first value and the second value.

24. The method of clauses 21-23, wherein the first input and the second input are coherent.

25. The method of clauses 21-24, wherein the first input is generated from a first power amplifier in a first transmitter path and the second input is generated from a second power amplifier in a second transmitter path.

26. The method of clauses 21-24, wherein the first input and the second input are generated from a same output of a mixer.

27. A circuit, comprising:

a transmitter output coupled to an input port of a coupler;

means for measuring power levels at a first output port of the coupler and a second output port of the coupler;

means for coupling a reference signal to the first output port of the coupler; and means for sweeping a phase of the transmitter output.

28. The circuit of clause 27, further comprising:

means for calculating an impedance based on results generated by the means for measuring the power levels and the means for sweeping the phase difference.

29. The circuit of clause 28, further comprising:

means for predistorting the transmitter output based on the impedance.

30. The circuit of clauses 27-29, wherein the circuit comprises a mm-wave circuit.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. A circuit, comprising:
a directional coupler having an input port, a through port, a coupled port, and an isolation port;
a first power amplifier coupled to the input port of the directional coupler;
a power detector configured to measure output levels from the coupled port and the isolation port of the directional coupler;
a reference signal generator coupled to the isolation port of the directional coupler;
a vector modulator configured to adjust a phase of a signal generated from the first power amplifier; and
a second power amplifier, wherein the reference signal generator is coupled to the isolation port of the directional coupler through the vector modulator and the second power amplifier.

2. The circuit of claim 1, wherein the reference signal generator is coupled to the isolation port of the directional coupler through a first switch.

3. The circuit of claim 2, wherein the reference signal generator is also coupled to the coupled port of the directional coupler through a second switch.

4. The circuit of claim 1, wherein the signal generated from the first power amplifier and a reference signal generated from the reference signal generator are coherent.

5. The circuit of claim 1, wherein the vector modulator is coupled to the first power amplifier.

6. The circuit of claim 1, wherein the second power amplifier is coupled to the isolation port of the directional coupler through a resistor and a first switch.

7. The circuit of claim 6, wherein the resistor is coupled to the coupled port of the directional coupler through a second switch.

8. The circuit of claim 1, further comprising:
a first impedance element coupled to the isolation port of the directional coupler; and
a second impedance element coupled to the coupled port of the directional coupler.

9. The circuit of claim 8, wherein at least one of the first and second impedance elements is tunable.

10. The circuit of claim 1, further comprising:
a mixer, wherein the first power amplifier and the reference signal generator are coupled to a same output of the mixer.

11. The circuit of claim 1, wherein the power detector is coupled to the coupled port of the directional coupler through a first switch and coupled to the isolation port of the directional coupler through a second switch.

12. An integrated circuit, comprising:
a first transmitter path that comprises a first vector modulator, a first power amplifier, a first directional coupler, and a power detector coupled to two ports of the first directional coupler; and
a second transmitter path that comprises a second vector modulator, a second power amplifier, wherein the second power amplifier is coupled to at least one of the two ports of the first directional coupler, wherein the first power amplifier and the second power amplifier are configured to generate signals that are coherent, and wherein the first vector modulator and second vector modulator are configured to creates a sweep of phase differences between the signals generated by the first power amplifier and the second power amplifier.

13. The integrated circuit of claim 12, wherein the power detector is configured to measure output levels from the two ports of the first directional coupler in sequence.

14. The integrated circuit of claim 12, wherein the first power amplifier is coupled to an input port of the first directional coupler, the second power amplifier is coupled to an isolation port of the first directional coupler, and the power detector is coupled to a coupled port and the isolation port of the first directional coupler.

15. The integrated circuit of claim 14, wherein the second power amplifier is also coupled to the coupled port of the first directional coupler.

16. The integrated circuit of claim 12, further comprising:
a second directional coupler, wherein the second power amplifier is coupled to the second directional coupler.

17. The integrated circuit of claim 12, wherein the second power amplifier is coupled to the first directional coupler through a switch.

18. A method of measuring impedance presented to a port of an integrated circuit, the integrated circuit including a directional coupler, the method comprising:
measuring a voltage level at a second port of the directional coupler in response to a first input received at a first port of the directional coupler;
measuring a voltage level at a third port of the directional coupler in response to the first input received at the first port of the directional coupler;
coupling a second input to the second port of the directional coupler;
measuring a voltage level at the second port of the directional coupler while adjusting a phase difference between the first input and the second input;
measuring a voltage level at the third port of the directional coupler while adjusting the phase difference between the first input and the second input; and
determining an impedance looking into the first port of the directional coupler based on the measured voltage levels and the adjusted phase differences.

19. The method of claim 18, wherein the determining of the impedance includes calculating an amplitude of an s-parameter by calculating a ratio of the voltage level at the second port and the voltage level at the third port prior to the coupling of the second input.

20. The method of claim 18, wherein the determining of the impedance includes calculating a phase of an s-parameter, and wherein the calculating of the phase of the s-parameter includes:
identifying a first value of the phase difference corresponding to a peak or a valley of the voltage level measured at the second port of the directional coupler;
identifying a second value of the phase difference corresponding to a peak or a valley of the voltage level measured at the third port of the directional coupler; and
calculating the phase of the s-parameter based on a difference between the first value and the second value.

21. The method of claim 18, wherein the first input and the second input are coherent.

22. The method of claim 18, wherein the first input is generated from a first power amplifier in a first transmitter path and the second input is generated from a second power amplifier in a second transmitter path.

23. The method of claim 18, wherein the first input and the second input are generated from a same output of a mixer.

24. A circuit, comprising:
a transmitter output coupled to an input port of a directional coupler;
means for measuring power levels at an isolation port of the directional coupler and at a coupled port of the directional coupler;
means for coupling a reference signal to the isolation port;
means for sweeping a phase of the transmitter output while the reference signal is coupled to the isolation port; and
means for calculating an impedance presented by the directional coupler to the transmitter output based on results generated by the means for measuring the power levels and the means for sweeping the phase.

25. The circuit of claim 24, further comprising:
means for predistorting the transmitter output based on the impedance.

26. The circuit of claim 24, wherein the circuit comprises a mm-wave circuit.

* * * * *